(12) United States Patent
Lee et al.

(10) Patent No.: US 8,785,918 B2
(45) Date of Patent: Jul. 22, 2014

(54) ORGANIC LIGHT EMITTING DEVICE AND ORGANIC LIGHT EMITTING DISPLAY DEVICE USING THE SAME

(71) Applicant: LG Display Co., Ltd., Seoul (KR)

(72) Inventors: Se Hee Lee, Paju-si (KR); Kwan Soo Kim, Gumi-si (KR); Sang Dae Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 16 days.

(21) Appl. No.: 13/727,260

(22) Filed: Dec. 26, 2012

(65) Prior Publication Data

US 2014/0103301 A1     Apr. 17, 2014

(30) Foreign Application Priority Data

Oct. 15, 2012   (KR) .......................... 10-2012-0114030

(51) Int. Cl.
*H01L 51/00*         (2006.01)
(52) U.S. Cl.
USPC ..................................... 257/40; 257/E51.022

(58) Field of Classification Search
USPC ..................... 257/40, 642, E51.022, E51.026
See application file for complete search history.

(56) References Cited

U.S. PATENT DOCUMENTS

| | | | |
|---|---|---|---|
| 8,367,798 B2* | 2/2013 | Yang et al. ..................... 528/380 |
| 8,431,434 B2* | 4/2013 | Tessler et al. .................. 438/99 |
| 2011/0049477 A1* | 3/2011 | Meng et al. ..................... 257/40 |
| 2011/0155248 A1* | 6/2011 | Kastler et al. ................. 136/263 |
| 2011/0284826 A1* | 11/2011 | Hayoz et al. .................... 257/40 |
| 2013/0248838 A1* | 9/2013 | Meng .............................. 257/40 |
| 2013/0277657 A1* | 10/2013 | Park et al. ....................... 257/40 |

* cited by examiner

*Primary Examiner* — Thao P Le
(74) *Attorney, Agent, or Firm* — Brinks Gilson & Lione

(57) ABSTRACT

Disclosed is a an organic light emitting device including a first electrode and a second electrode; and an organic layer formed between the first electrode and the second electrode, in which the organic layer includes a compound represented by Formula 1 and the second electrode is a double-layer structure comprised of LiF:Mg. Accordingly, an organic light emitting device which has excellent voltage efficiency and emission efficiency and may improve service-life characteristics, and an organic light emitting display device using the same may be provided.

11 Claims, 3 Drawing Sheets

ORGANIC LIGHT EMITTING DEVICE AND ORGANIC LIGHT EMITTING DISPLAY DEVICE USING THE SAME

CROSS-REFERENCE TO RELATED APPLICATIONS

This application claims the benefit of the Korean Patent Application No. 10-2012-0114030 filed on Oct. 15, 2012, which is hereby incorporated by reference as if fully set forth herein.

BACKGROUND

1. Field of the Disclosure

The present disclosure relates to an organic light emitting device and an organic light emitting display device using the same.

2. Discussion of the Related Art

Organic light emitting display devices are self-emitting display devices, and have a better viewing angle and contrast ratio than liquid crystal display (LCD) devices. Also, since organic light emitting display devices do not need a separate backlight, it is possible to make thee devices lighter and thinner. Organic light emitting display devices also have excellent power consumption characteristics compared to LCD devices and the other flat panel display devices. Furthermore, the organic light emitting display devices are driven with a low direct current (DC) voltage, have a fast response time, and are low in manufacturing cost.

In organic light emitting display devices, an electron and a hole are respectively injected from a cathode and an anode into an emitting material layer, and, when an exciton in which the injected electron and hole are combined is shifted from an excited state to a base state, light is emitted. In this case, the types of organic light emitting display devices are categorized into a top emission type, a bottom emission type, and a dual emission type according to an emission direction of light, and categorized into a passive matrix type and an active matrix type according to a driving type.

Accordingly, when scan signals, data signals, electricity and the like are supplied to a plurality of sub-pixels disposed in the form of a matrix, organic light emitting devices may display an image by allowing the selected sub-pixels to emit light. In this case, the sub-pixels include an organic light emitting device including a thin film transistor (TFT) including a switching thin film transistor, a driving thin film transistor and a capacitor, a first electrode connected to the driving transistor included in the thin film transistor, an organic layer, and a second electrode.

Herein, the organic layer may include a plurality of layers facilitating the injection and transport of electrons and holes, and an emission layer, and organic light emitting devices having the above structure have problems that the difference in band gap may disturb the charge balance, cause the transporting ability of holes to deteriorate, and cause the service life to be shortened.

Further, devices in the related art are advantageous in terms of light emission characteristics, but have a low glass transition temperature and very poor thermal stability. Thus, when the devices are subjected to high temperature deposition process under vacuum, there are shortcomings such as deterioration of material characteristics and the like. Herein, since the efficiency of consumption power=(π/voltage)×current efficiency, the efficiency of consumption power is inversely proportional to the voltage. That is, if consumption power of an organic light emitting device is to be decreased, the power efficiency needs to be high, but devices in the related art have a high driving voltage and thus are not significantly advantageous in terms of consumption power.

Accordingly, there is a need for developing various devices which may improve the service-life characteristics of the organic light emitting device and may improve consumption power characteristics while the devices may be applied to large areas.

SUMMARY

Accordingly, the present invention is directed to an organic light emitting device which has excellent voltage efficiency and emission efficiency and may improve service-life characteristics and an organic light emitting display device that substantially obviate one or more problems due to limitations and disadvantages of the related art.

An aspect of the present invention is directed to provide an organic light emitting device including a first electrode and a second electrode; and an organic layer formed between the first electrode and the second electrode, in which the organic layer includes a compound represented by Formula 1 and the second electrode is a double-layer structure comprised of LiF:Mg.

[Formula 1]

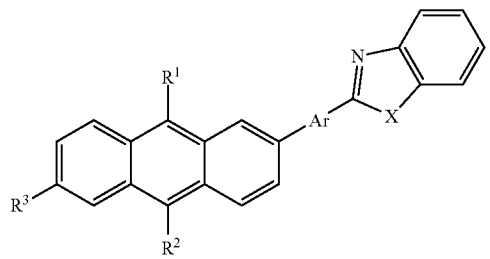

Here, $R^1$ and $R^2$ are each independently or simultaneously a group derived from the group consisting of a hydrogen atom, an aliphatic hydrocarbon having 1 to 20 carbon atoms, phenyl, naphthyl, biphenyl, anthracenyl, an aromatic heterocyclic ring, or an aromatic ring, Ar is a group derived from the group consisting of phenyl, naphthyl, biphenyl, anthracenyl, an aromatic heterocyclic ring, or an aromatic ring, $R^3$ is a group derived from the group consisting of a hydrogen atom, an alkyl group or aliphatic hydrocarbon having 1 to 6 carbon atoms, substituted phenyl, naphthyl, biphenyl, anthracenyl, an aromatic heterocyclic ring, or an aromatic ring, X is $NR_4$, a sulfur atom, or an oxygen atom, and $R^4$ is a group derived from the group consisting of a hydrogen atom, an alkyl group or aliphatic hydrocarbon having 1 to 7 carbon atoms, phenyl, naphthyl, biphenyl, anthracenyl, or an aromatic heterocyclic ring.

In another aspect of the present invention, there is provided an organic light emitting display device including: a substrate on which an active area having an active area having a plurality of pixel areas is defined; a driving thin film transistor formed on each of the plurality of pixel areas; a passivation layer formed on the driving thin film transistor; a first electrode connected to a drain electrode exposed by a contact hole formed on the passivation layer; an organic layer formed on the first electrode and including a compound represented by Formula 1; and a second electrode which is formed on the organic layer and is a double-layer comprised of LiF:Mg.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EXEMPLARY EMBODIMENTS

Figure 1:
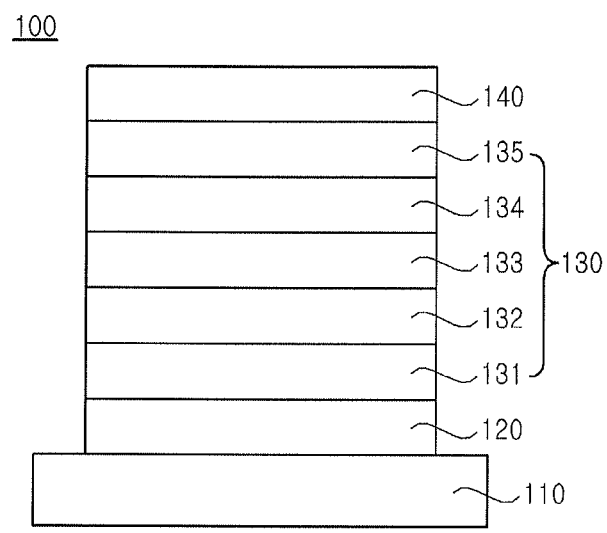
FIG. 1 a cross section view schematically illustrating the structure of an organic light emitting device according to an embodiment of the present invention.

Hereinafter, embodiments of the present invention will be described in detail with reference to the accompanying drawings. Like reference numerals refer to like elements throughout. In the following description, when the detailed description of the relevant known function or configuration is determined to unnecessarily obscure the important point of the present invention, the detailed description is not provided.

FIG. 1 a cross section view schematically illustrating the structure of an organic light emitting device according to an embodiment of the present invention.

As illustrated in FIG. 1, the organic light emitting device according to an embodiment of the present invention includes a first electrode, a second electrode, and an organic layer formed between the first electrode and the second electrode. At this time, the organic layer includes a compound represented by the following Formula 1, and the second electrode is formed with a double-layer structure comprised of LiF:Mg.

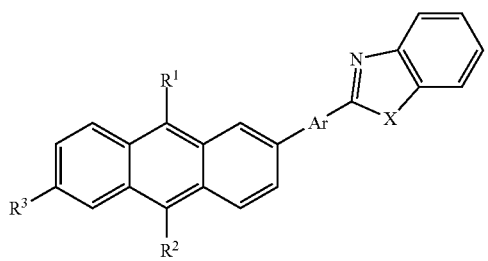

[Formula 1]

Here, $R^1$ and $R^2$ are each independently or simultaneously a group derived from the group consisting of a hydrogen atom, an aliphatic hydrocarbon having 1 to 20 carbon atoms, phenyl, naphthyl, biphenyl, anthracenyl, an aromatic heterocyclic ring, or an aromatic ring, Ar is a group derived from the group consisting of phenyl, naphthyl, biphenyl, anthracenyl, an aromatic heterocyclic ring, or an aromatic ring, $R^3$ is a group derived from the group consisting of a hydrogen atom, an alkyl group or aliphatic hydrocarbon having 1 to 6 carbon atoms, a substituted phenyl, naphthyl, biphenyl, anthracenyl, an aromatic heterocyclic ring, or an aromatic ring, X is $NR_4$, a sulfur atom, or an oxygen atom, and $R^4$ is a group derived from a hydrogen atom, an alkyl group or aliphatic hydrocarbon having 1 to 7 carbon atoms, phenyl, naphthyl, biphenyl, anthracenyl, or an aromatic heterocyclic ring, In an embodiment, an organic light emitting device 100 forms a substrate 110 on which an active are having an active area having a plurality of pixel areas is defined and forms a driving thin film transistor formed on each of the plurality of pixel areas and a passivation layer thereon. Further, a first electrode connected to a drain electrode exposed by a contact hole on a passivation layer is formed, an organic layer including the compound represented by Formula 1 is formed on the first electrode, and a second electrode having a double-layer structure comprised of LiF:Mg is formed.

First, the substrate 110 has a plurality of pixel areas divided by gate lines (not shown) and data lines (not shown), and a driving thin film transistor is formed in each of the plurality of pixel areas.

Here, the substrate 110 may be formed of a transparent glass material, or a plastic or polymer film having excellent flexibility in order to implement a flexible display.

Although not shown in the drawing, a buffer layer (not shown) such as silicon oxide ($SiO_2$), silicon nitride ($SiN_x$) and the like may be further included on the substrate 110 in order to protect a driving device formed in the subsequent process from impurities such as alkaline ions and the like to be released.

The thin film transistor (TFT) includes a driving thin film transistor and a switching thin film transistor, and in addition to them, a compensation circuit for compensating for the threshold voltage of the driving thin film transistor, that is, a plurality of capacitors may be additionally formed and freely disposed. At this time, the driving thin film transistor (not shown) is connected to the switching thin film transistor and controlled, and a voltage applied to a first electrode 120 may be controlled according to the on and off of the driving transistor.

The passivation layer (not shown) serves as planarization and protection of the thin film transistor, and may be comprised in various forms. For example, it is possible to apply the passivation layer in various forms as the passivation layer may be formed of an organic material such as benzocyclobutene (BCB), acryl or the like, or an inorganic material such as SiNx, and may be comprised of a monolayer, or a double or multi layer.

The first electrode 120 is independently formed as an anode electrode in each sub-pixel on the passivation layer (not shown) to be connected to the drain electrode.

Here, the first electrode 120 functions as an electrode among the electrodes included in the organic light emitting device, and may be formed of a electrically conductive material. The first electrode 120 may be a multilayered reflective electrode formed of ITO, IGZO, IZO, IZTO, ZnO, ZTO, FTO, FZO AZO, ATO, GZO or $In_2O_3$ on a reflection film after the reflection film is formed of Ag, Mg, Al, Pt, Pd, Au, Ni, Nd, Ir, Cr, compounds thereof and the like. For example, the electrode may be a multilayer formed of a compound containing Ag in an amount of 90% or more to a thickness from about 500 Å to about 2,000 Å and formed of ITO to a thickness from about 50 Å to about 200 Å.

An organic layer 130 is formed on the first electrode 120, and includes an emission layer, which emits red, green and blue light.

Here, the organic layer 130 may be comprised of a single layer consisting of an emission material, or comprised of a multilayer of a hole injection layer, a hole transporting layer, an emission layer, an electron transporting layer and an electron injection layer, and may be formed with a thickness from about 150 Å to about 450 Å.

The hole injection layer 131 may serve to facilitate the injection of holes from the first electrode 120 to the emission layer and may be formed of copper phthalocyanine (CuPc), poly(3,4)-ethylenedioxythiphene (PEDOT), polyaniline (PANI), or N,N-dinaphthyl-N,N'-diphenyl benzidine (NPD), but the spirit of the present invention is not limited thereto.

The hole transporting layer 132 may easily convey the holes to the emission layer, and may serve to enhance the emission efficiency by suppressing electrons generated from the cathode electrode from moving to the emission area. That is, the hole injection layer 132 serves to facilitate the transporting of holes, and may be formed of N,N-dinaphthyl-N, N'-diphenyl benzidine (NPD), N,N'-bis-(3-methylphenyl)-N, N'-bis-(phenyl)-benzidine (TPD), 4-(9H-carbazol-9-yl)-N, N-bis[4-(9H-carbazol-9-yl)phenyl]-benzenamine (TCTA), 4,4'-N,N'-dicarbazole-biphenyl (CBP), s-TAD, or 4,4',4''-Tris(N-3-methylphenyl-N-phenyl-amino)-triphenylamine (MTDATA), but the spirit of the present invention is not limited thereto.

An emission layer 133 includes a host and a dopant. In addition, the emission layer 133 may include materials, which emit red, green, blue and white light, and may be formed by using a phosphorescent or fluorescent material.

Here, when the emission layer 133 emits red light, the emission layer includes a host material including carbazole biphenyl (CBP) or 1,3-bis(carbazol-9-yl) (mCP), and the host material may be a phosphorescent material including a dopant which includes one or more selected from PIQIr(acac) (bis(1-phenylisoquinoline)acetylaetonate iridium, PQIr (acac)(bis(1-phenylquinoline)acetylacetonate iridium), PQIr (tris(1-phenylquinoline)iridium), or otherwise PtOEP (octaethylporphyrin platinum) and a fluorescent material including PBD:Eu(DBM)$_3$(Phen) or perylene, but is not limited thereto.

When the emission layer 133 emits green light, the emission layer includes a host material including CBP or mCP, may be a phosphorescent material including a dopant material which includes Ir(ppy)$_3$(fac tris(2-phenylpyridine)iridium), or otherwise a fluorescent material including Alq3(tris (8-hydroxyquinolino)aluminum), but is not limited thereto.

When the emission layer 133 emits blue light, the emission layer includes a host material including CBP or mCP, and the host material may be a phosphorescent material including (4,6-F$_2$ppy)$_2$Irpic or L2BD111.

Otherwise, the host material may be a fluorescent material including one selected from spiro-DPVBi, spiro-6P, distyryl benzene (DSB), a PFO-based polymer and a PPV-based polymer, but is not limited thereto.

Meanwhile, an electron transporting layer 134 serves to facilitate the transport of electrons, and an electron injection layer 135 serves to facilitate the injection of electrons.

Here, the electron transporting layer 134 or the electron injection layer 135 may include a compound of Formula 1, and may further include a lithium quinolate (LiQ) monomer or lithium quinolate (LiQ) trimer.

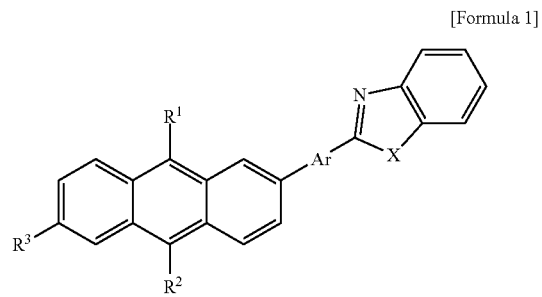

[Formula 1]

Here, $R^1$ and $R^2$ are each independently or simultaneously a group derived from the group consisting of a hydrogen atom, an aliphatic hydrocarbon having 1 to 20 carbon atoms, phenyl, naphthyl, biphenyl, anthracenyl, an aromatic heterocyclic ring, or an aromatic ring, Ar is a group derived from the group consisting of phenyl, naphthyl, biphenyl, anthracenyl, an aromatic cyclic ring, or an aromatic ring, $R^3$ is a group derived from the group consisting of a hydrogen atom, an alkyl group or aliphatic hydrocarbon having 1 to 6 carbon atoms, a substituted phenyl, naphthyl, biphenyl, anthracenyl, an aromatic heterocyclic ring, or an aromatic ring, X is $NR_4$, a sulfur atom, or an oxygen atom, and $R^4$ is a group derived from a hydrogen atom, an alkyl group or aliphatic hydrocarbon having 1 to 7 carbon atoms, phenyl, naphthyl, biphenyl, anthracenyl, or an aromatic heterocyclic ring, In the present specification, it has been described that the organic layer 130 includes the hole injection layer 131, the hole transporting layer 132, the emission layer 133, the electron transporting layer 134 and the electron injection layer 135, but at least one of the host injection layer, the host transporting layer, the emission layer, the electron transporting layer and the electron injection layer may be omitted.

Meanwhile, a second electrode 140 is formed on the entire surface of the substrate 110 on the organic layer 130. Here, the second electrode 140 may be formed with a double-layer structure, and accordingly, one double-layer structure selected from single/single, single/mixed, mixed/single and mixed/mixed double layers may be formed of a metal material or an inorganic material. Ag, Mg, Yb, Li, Ca and the like may be included as the metal, and Li$_2$O, CaO, LiF, MgF$_2$ may be included as the inorganic material, and in the case of a layer in which the metal: the organic material or the metal: the metal is mixed, the double-layer structure may be formed at a ratio of 1:1 to 1:10.

In an embodiment, the second electrode 140 may be variously designed and modified, while controlling the sheet resistance to have a low value and the work function to become 4.7 eV or less. For example, the second electrode 140 is formed to a thickness of about 10 Å to about 50 Å at a ratio of LiF:Mg=1:0.2 to 1:5, and may be formed on the upper portion thereof to a thickness of 100 Å to 300 Å at a ratio of Ag:Mg=3:1.

Therefore, in the organic light emitting display device according to an embodiment of the present invention, when a predetermined voltage is applied to the first electrode 120 and the second electrode 140 according to the selected color signal, holes and electrons are transported to the organic layer to form excitons. When the exciton moves from excited state to ground state, light is generated and emitted in the form of visible light. The emitted light at this time passes through the transparent second electrode 140 and exits out of the electrode, thereby implementing any image.

Meanwhile, in order to protect the emission diode of the sub-pixel, the encapsulation process needs to be performed, and a general thin film encapsulation method may be used in the present invention. The thin film encapsulation method is a known technology, and thus the detailed description thereof will be omitted in the present specification.

Hereinafter, characteristics of the organic light emitting device according to an embodiment of the present invention will be evaluated. However, the following Examples are to illustrate the present invention, and the present invention is not limited by the following Examples.

First, in order to evaluate characteristics of the organic light emitting device according to an embodiment of the present invention, 2 in Table 1 was experimented as an object for the second electrodes in Comparative Examples 1 and 2 and Example.

As shown in the following Table 1, in the organic light emitting device according to the present invention, the second electrode (2 in Table 1) according to the present invention was manufactured while the work function was controlled compared to the second electrode in the related art (1 in Table 1).

TABLE 1

|  | Classification | |
| --- | --- | --- |
|  | 1 | 2 |
| Structure | Single layer (Mg:Ag) | Double layer (Mg:LiF/Ag:Mg) |
| Ratio | 10:1 | 1:1/3:1 |
| Thickness | 160 □ | 30 □/150 □ |
| Sheet resistance | 35 | 9.7 |
| Work function | 3.7 eV | 4.1 to 4.7 eV |

That is, as the electron injection barrier of the second electrode 140 increases, the formation of excitons at the interface of the hole transporting layer and the emission layer may be moved inside the emission layer, and it is possible to apply the second electrode 140 to a large-area display panel as the sheet resistance decreases. Here, as the electron injection barrier of the second electrode 140 increases, the driving voltage may be increased, but the voltage increase may be blocked by incorporating the compound of Formula 1 into the electron transporting layer or electron injection layer.

Comparative Example 1

A glass substrate was patterned to have an emission area of 3 mm×3 mm and washed, and then a multilayer structure having thicknesses of 70 Å in ITO, 100 Å in Ag alloy and 70 Å in ITO was deposited thereon as a first electrode.

Next, hexaaza-triphenylene-hexanitrile (HATCN) was deposited to a thickness of 100 Å on the first electrode, NPD was deposited to a thickness of 1,200 Å, and then a host CBP as a blue emission layer was doped with a dopant (4,6-$F_2$ ppy)$_2$Irpic in an amount of 5% to be deposited to a thickness of 200 Å.

Subsequently, Alq$_3$ was deposited to a thickness of 200 Å, and then a double-layer structure having at a ratio of Mg:LiF=1:1 with a thickness of 30 Å and at a ratio of Ag:Mg=3:1 with a thickness of 160 Å was deposited thereon as a second electrode (2 in Table 1) to manufacture an organic light emitting device.

Comparative Example 2

A glass substrate was patterned to have an emission area of 3 mm×3 mm and washed, and then a multilayer structure having thicknesses of 70 Å in ITO, 100 Å in Ag alloy and 70 Å in ITO was deposited thereon as a first electrode.

Next, hexaaza-triphenylene-hexanitrile (HATCN) was deposited to a thickness of 100 Å on the first electrode, NPD was deposited to a thickness of 1,200 Å, and then a host CBP as a blue emission layer was doped with a dopant (4,6-$F_2$ ppy)$_2$Irpic in an amount of 5% to be deposited to a thickness of 200 Å.

Subsequently, Alq$_3$:lithium quinolate (LiQ) trimer was deposited to a thickness of 360 Å at a ratio of 1:1, and then a double-layer structure having a ratio of Mg:LiF=1:1 with a thickness of 30 Å and a ratio of Ag:Mg=3:1 with a thickness of 160 Å was deposited thereon as a second electrode (2 in Table 1) to manufacture an organic light emitting device.

Embodiment

A glass substrate was patterned to have an emission area of 3 mm×3 mm and washed, and then a multilayer structure having thicknesses of 70 Å in ITO, 100 Å in Ag alloy and 70 Å in ITO was deposited thereon as a first electrode.

Next, hexaaza-triphenylene-hexanitrile (HATCN) was deposited to a thickness of 100 Å on the first electrode, NPD was deposited to a thickness of 1,200 Å, and then a host CBP as a blue emission layer was doped with a dopant (4,6-$F_2$ ppy)$_2$Irpic in an amount of 5% to be deposited to a thickness of 200 Å.

Subsequently, the compound of Formula 1:lithium quinolate (LiQ) trimer was deposited to a thickness of 360 Å at a ratio of 1:1, and then a double-layer structure having a ratio of Mg:LiF=1:1 with a thickness of 30 Å and a ratio of Ag:Mg=3:1 with a thickness of 160 Å was deposited thereon as a second electrode (2 in Table 1) to manufacture an organic light emitting device.

Figure 2:
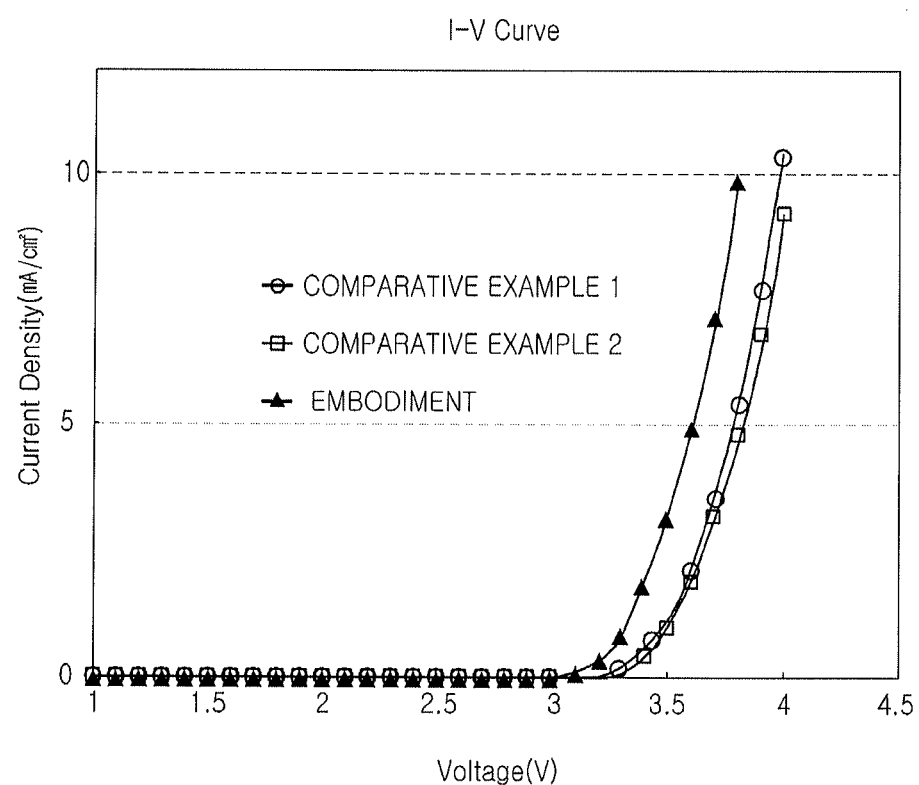
FIG. 2 is a view illustrating the current density depending on the driving voltages of organic light emitting devices according to Example and Comparative Examples 1 and 2.
Figure 3:
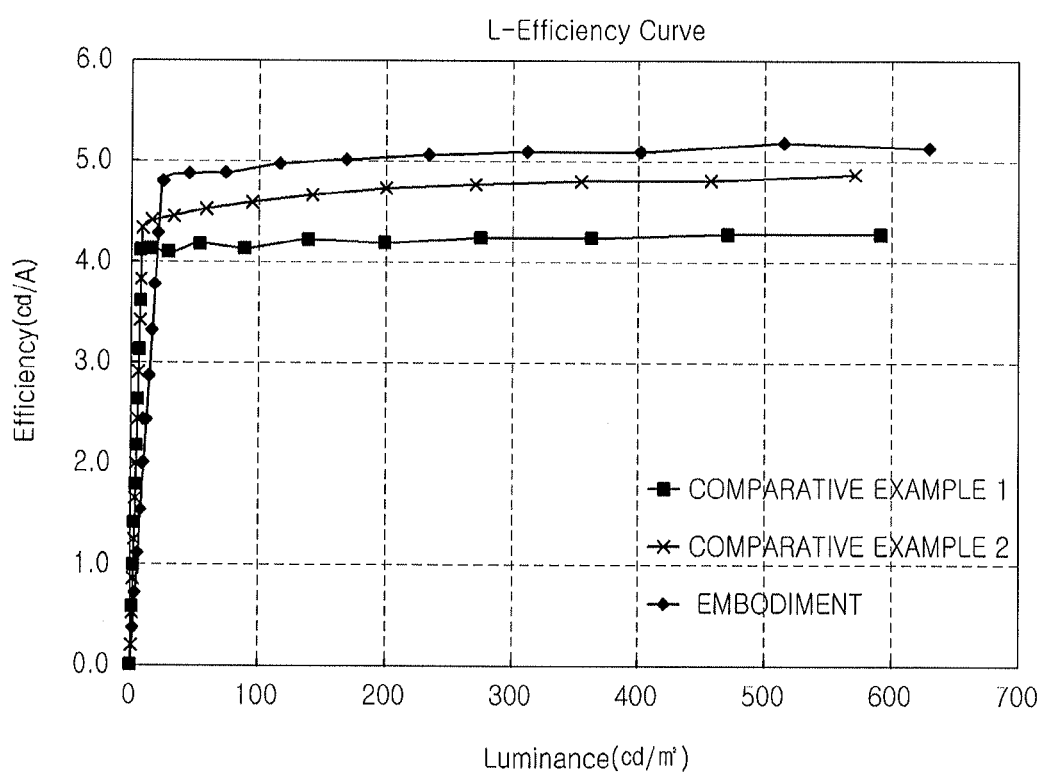
FIG. 3 is a view illustrating the efficiency depending on the luminance of organic light emitting devices according to Example and Comparative Examples 1 and 2.
Figure 4:
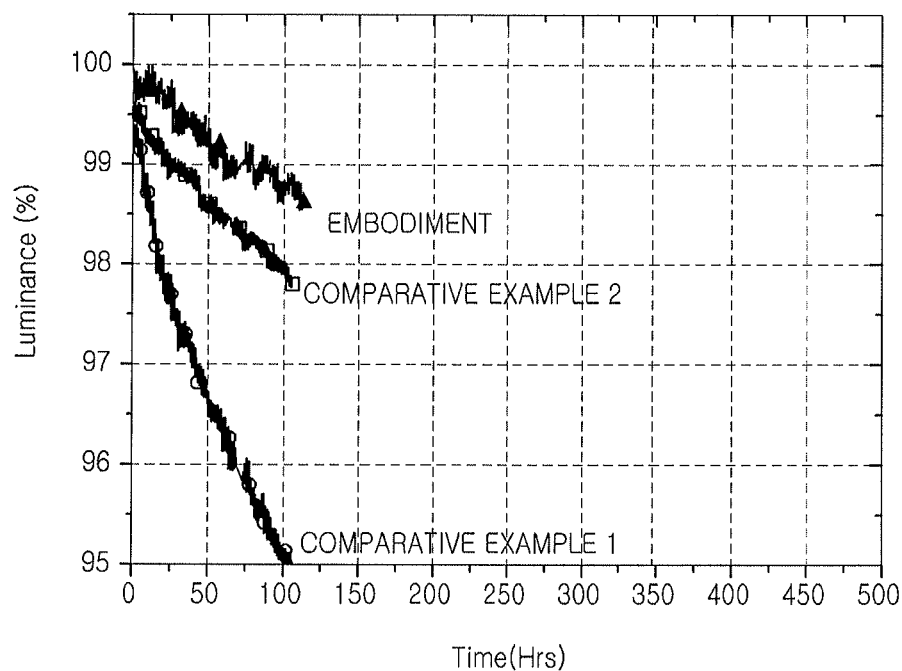
FIG. 4 is a view illustrating the service-life of organic light emitting devices according to Example and Comparative Examples 1 and 2.

Meanwhile, FIGS. 2 to 4 are views illustrating the current density according to the driving voltage, the efficiency according to the luminance and the service life, of the organic light emitting devices according to Example and Comparative Examples 1 and 2.

As illustrated in FIG. 2, the current density (mA/cm$^2$) was evaluated when the organic light emitting devices according to Example and Comparative Examples 1 and 2 had a driving voltage of 1 to 4.5 V.

At this time, the current density (mA/cm2) in the organic light emitting device manufactured in Example was increased at a low driving voltage (V) compared to the organic light emitting devices manufactured in Comparative Examples 1 and 2. That is, it may be confirmed that when the driving voltage is decreased, the device is significantly advantageous in terms of consumption power.

As illustrated in FIG. 3, when the organic light emitting devices according to Example and Comparative Examples 1 and 2 had a luminance of 0 to 700 cd/m$^2$, the efficiency characteristics (cd/A) were evaluated.

At this time, it may be confirmed that the organic light emitting device manufactured in Example had improved efficiency characteristics (cd/A) according to the luminance (cd/m$^2$) compared to the organic light emitting devices in Comparative Examples 1 and 2.

As illustrated in FIG. 4, the emission efficiencies (%) of the organic light emitting devices according to Example and Comparative Example 1 and 2 were measured over time (Hrs), and the experiment was evaluated under the condition of a current density of 10 mA/cm$^2$.

At this time, it may be confirmed that the organic light emitting device manufactured in Example exhibited better service-life characteristics than those manufactured in Comparative Examples 1 and 2.

Therefore, the organic light emitting device according to an embodiment of the present invention may have excellent voltage efficiency and emission efficiency and service-life characteristics may be improved by controlling the work functions of the electron transporting layer including the compound of Formula 1, and the second electrode to 4.1~4.7 eV.

According to the present invention, an organic light emitting display device may be provided, in which the sheet resistance of the second electrode is greatly reduced, a work function may be controlled to be applied to a large-area display panel, and excellent emission efficiency is possessed. In addition, it is possible to manufacture a device which may improve the service-life characteristics by using the compound of Formula 1 to control electron injection and mobility, thereby causing holes and electrons to be re-combined in the emission layer.

It will be appreciated by those skilled in the art that the above-described present invention may be implemented into other specific forms without departing from the technical spirit thereof or essential characteristics.

Thus, it is to be appreciated that embodiments described above are intended to be illustrative in every sense, and not restrictive. The scope of the present invention is represented by the claims to be described below rather than the detailed description, and it is to be interpreted that the meaning and scope of the claims and all the changes or modified forms derived from the equivalents thereof come within the scope of the present invention.

What is claimed is:

1. An organic light emitting device, comprising:
a first electrode and a second electrode; and
an organic layer disposed between the first electrode and the second electrode,
wherein the organic layer comprises a compound represented by the following Formula 1, and the second electrode is a double layer comprised of LiF:Mg:

[Formula 1]

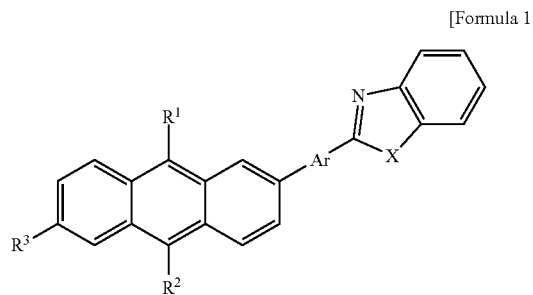

where, $R^1$ and $R^2$ are each independently or simultaneously a group derived from the group consisting of a hydrogen atom, an aliphatic hydrocarbon having 1 to 20 carbon atoms, phenyl, naphthyl, biphenyl, anthracenyl, an aromatic heterocyclic ring, or an aromatic ring, Ar is a group derived from the group consisting of phenyl, naphthyl, biphenyl, anthracenyl, an aromatic heterocyclic ring, or an aromatic ring, $R^3$ is a group derived from the group consisting of a hydrogen atom, an alkyl group or aliphatic hydrocarbon having 1 to 6 carbon atoms, a substituted phenyl, naphthyl, biphenyl, anthracenyl, an aromatic heterocyclic ring, or an aromatic ring, X is $NR_4$, a sulfur atom, or an oxygen atom, and $R^4$ is a group derived from a hydrogen atom, an alkyl group or aliphatic hydrocarbon having 1 to 7 carbon atoms, phenyl, naphthyl, biphenyl, anthracenyl, or an aromatic heterocyclic ring.

2. The organic light emitting device of claim 1, wherein the second electrode is a double layer structure in which Ag:Mg is formed on the upper portion of LiF:Mg.

3. The organic light emitting device of claim 1, wherein the second electrode is formed at LiF:Mg=1:0.2 to 1:5.

4. The organic light emitting device of claim 1, wherein the second electrode is a structure in which LiF:Mg is formed to have about 10 to about 50 Å.

5. The organic light emitting device of claim 2, wherein the second electrode is a structure in which Ag:Mg is formed at 1:1 to 9:1.

6. The organic light emitting device of claim 2, wherein the second electrode is a structure in which Ag:Mg is formed from about 100 Å to about 300 Å.

7. The organic light emitting device of claim 1, wherein the organic layer comprises at least one layer selected from the group consisting of a hole injection layer, a hole transporting layer, an electron blocking layer, an emission layer, a hole blocking layer, an electron transporting layer and an electron injection layer, and the compound represented by Formula 1 is included in the electron injection layer or the electron transporting layer.

8. The organic light emitting device of claim 7, further comprising a lithium quinolate (LiQ) monomer or Lithium quinolate (LiQ) trimer in one of the electron injection layer or the electron transporting layer.

9. The organic light emitting device of claim 1, wherein the second electrode has a work function of 4.1 eV to 4.7 eV.

10. The organic light emitting device of claim 1, wherein the first electrode is formed with a multilayer structure in which one opaque conductive material of aluminum (Al), silver (Ag) and magnesium (Mg), and a transparent conductive material comprising one of indium tin oxide (ITO), indium zinc oxide (IZO), zinc oxide (ZnO), indium gallium zinc oxide (IGZO) and $In_2O_3$ are stacked.

11. An organic light emitting display device, comprising:
a substrate on which an active area having a plurality of pixel areas is defined;
a driving thin film transistor disposed on each of the plurality of pixel areas;
a passivation layer disposed on the driving thin film transistor;
a first electrode connected to a drain electrode exposed by a contact hole formed on the passivation layer;
an organic layer disposed on the first electrode and comprising a compound represented by the following Formula 1; and
a second electrode which is disposed on the organic layer and is a double-layer comprised of LiF:Mg:

[Formula 1]

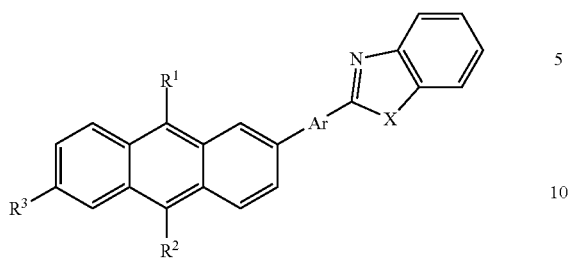

where, $R^1$ and $R^2$ are each independently or simultaneously a group derived from the group consisting of a hydrogen atom, an aliphatic hydrocarbon having 1 to 20 carbon atoms, phenyl, naphthyl, biphenyl, anthracenyl, an aromatic heterocyclic ring, or an aromatic ring, Ar is a group derived from the group consisting of phenyl, naphthyl, biphenyl, anthracenyl, an aromatic heterocyclic ring, or an aromatic ring, $R^3$ is a group derived from the group consisting of a hydrogen atom, an alkyl group or aliphatic hydrocarbon having 1 to 6 carbon atoms, a substituted phenyl, naphthyl, biphenyl, anthracenyl, an aromatic heterocyclic ring, or an aromatic ring, X is $NR_4$, a sulfur atom, or an oxygen atom, and $R^4$ is a group derived from a hydrogen atom, an alkyl group or aliphatic hydrocarbon having 1 to 7 carbon atoms, phenyl, naphthyl, biphenyl, anthracenyl, or an aromatic heterocyclic ring.

\* \* \* \* \*